United States Patent [19]
Bradford

[11] Patent Number: 5,218,510
[45] Date of Patent: Jun. 8, 1993

[54] SUSPENSION PACKAGING FOR STATIC-SENSITIVE PRODUCTS

[75] Inventor: Judson A. Bradford, Holland, Mich.

[73] Assignee: Bradford Company, Holland, Mich.

[21] Appl. No.: 763,999

[22] Filed: Sep. 23, 1991

[51] Int. Cl.5 .......................... H05F 1/00; B65D 81/10
[52] U.S. Cl. ..................................... 361/220; 206/334; 206/583
[58] Field of Search ................ 361/212, 220; 206/583, 206/328, 334, 521

[56] References Cited

U.S. PATENT DOCUMENTS

| | | |
|---|---|---|
| 3,211,503 | 10/1965 | Barnes . |
| 3,406,746 | 10/1968 | Abildgaard . |
| 3,572,499 | 3/1971 | Mondano .................. 206/1 |
| 3,669,337 | 6/1972 | Struble .................. 229/14 BA |
| 4,109,818 | 8/1978 | Hascoe et al. .......... 220/200 |
| 4,463,851 | 8/1984 | Cecil ..................... 206/328 |
| 4,557,379 | 12/1985 | Lane et al. ............ 206/328 |
| 4,564,880 | 1/1986 | Christ et al. .......... 361/212 |
| 4,609,104 | 9/1986 | Kasper et al. ......... 206/334 |
| 4,677,809 | 7/1987 | Long et al. . |
| 4,684,020 | 8/1987 | Ohlbach ................. 206/328 |
| 4,754,880 | 7/1988 | Tehrani ................. 206/523 |
| 4,759,444 | 7/1988 | Barmore ............... 206/521.1 |
| 4,865,197 | 9/1989 | Craig ..................... 206/328 |
| 4,915,222 | 4/1990 | Reidinger et al. .... 206/328 |

Primary Examiner—A. D. Pellinen
Assistant Examiner—David Osborn
Attorney, Agent, or Firm—Wood, Herron & Evans

[57] ABSTRACT

A method and apparatus for inexpensively but effectively packaging electrostatic sensitive products by sandwiching the product between opposing plies of an electrostatic discharge protective film while at the same time securing the edges of the plies between two opposing parts of a package so that the product is suspended by the plies within the package. A stretchable, heat shrinkable, static discharge protective film surrounds and encloses each of the opposing package parts in order to provide the suspending plies to suspend the product.

28 Claims, 2 Drawing Sheets

SUSPENSION PACKAGING FOR STATIC-SENSITIVE PRODUCTS

This invention relates to packaging for articles adversely affected by electrostatic discharge and, particularly, the packaging of products which require physical protection as well as protection from electrostatic discharge.

BACKGROUND OF THE INVENTION

Electrostatic discharge is a naturally occurring electronic phenomenon. Triboelectric charge, often referred to as static electricity, builds up in all materials to some degree, and is eventually discharged as the charge traverses a path towards an electric ground. Static electricity build-up is strongest in insulative materials.

Many electronic components can be easily damaged by electrostatic discharge of relatively small magnitude. Magnitudes as small as 50 volts can permanently damage some of these devices, such as microcircuits. For comparative purposes, to illustrate the extreme sensitivity of microcircuits to this phenomenon, a visible charge from a human hand to a doorknob in winter will often exceed 10,000 volts. Thus, extreme caution must be taken in protecting such microcircuit components from electrostatic discharge.

To provide protection from electrostatic discharge for packaged articles, a principle of physics referred to as the Faraday Cage effect is often employed. Electricity does not penetrate a conductive enclosure. The static electric charge will go around the enclosed space, seeking the path of least electrical resistance enroute to ground. By surrounding a static sensitive product with a conductive enclosure, the product is shielded from electrostatic discharge originating outside of the enclosure. However, such Faraday Cage-type packaging, typically, does not protect against static electricity generated internally of the package. Static electricity can be generated when two surfaces rub against each other, as for example when a conductive and a non-conductive surface rub against each other. Specifically, static electricity can be generated internally of a package by an electrical component or other product rubbing against an internal portion of the package or by one portion of the package rubbing against another portion of the package. To protect a product against internally generated static electricity, products are commonly packaged in anti-static (now generally referred to as static-dissipative) packaging material. Such packaging material has a surface resistivity characteristic which prevents a static charge from being built up upon or generated by rubbing against a static-dissipative material. Thus, static-dissipative and electrically conductive packaging materials provide protection against electrostatic charges built up inside and outside a package respectively. More protection is therefore provided when such materials are used in combination rather than separately.

Many products and particularly electrical components such as micro-chips require, in addition to protection against electrostatic discharge, physical protection against damage resulting from impact or contact with outside objects or forces.

It has therefore been an object of this invention to provide a package which provides electrostatic discharge protection as well as physical protection of a packaged product.

Still another object of the present invention has been to provide a package which affords physical protection of the packaged article and which prevents the product from making contact with any surface not made of static dissipative material.

One attempt at protecting static electricity sensitive articles against static electricity is disclosed in U.S. Pat. No. 4,658,985 to McNulty. This patent discloses a bag having two plies of anti-static (polyethylene) material and an electrically conductive fabric or mat embedded therebetween to provide a shield from electrostatic discharge for a bagged article. Because the bag is lined with an anti-static material, it affords protection against electrostatic charge generated internally of the package, but the bag does not, by itself, provide adequate physical protection of the product there enclosed. In order to provide physical protection, the bagged article must be placed within another cell in a rigid container. This results in additional material and material handling costs requiring a bag enclosure and additional labor costs associated with bagging the component or product. Therefore, another object of the present invention is to provide an inexpensive package which not only protects the product or article from electrostatic discharge but also one which provides physical protection of the article.

Two other packages for protecting static electricity sensitive articles or products against static electricity are disclosed in U.S. Pat. No. 4,557,379 to Lane et al and U.S. Pat. No. 4,564,880 to Christ et al. These patents disclose molded plastic clam shell packages made of electrically conductive material for protecting electrostatic sensitive parts, specifically integrated circuit boards and circuits, respectively, between the two halves of the clam shell. Because the dimensions of each package are fixed by the mold design used in manufacturing each package, the variety of product sizes and shapes which each molded package can accommodate is limited. While changes can be made to make these packages somewhat more versatile (for example, changing the mold design to accommodate a product having a different size or shape), such changes add additional costs to already expensive packaging. Thus, it is a further object of the present invention to provide an electrostatic discharge protective package which can be easily and inexpensively made to conform itself to a wide variety of product and article sizes and shapes.

The above-identified U.S. Pat. No. 4,564,880, in addition to providing a package made of electrically conductive material provides an opening on one side of the package which allows part of the enclosed product to be viewed. While this package allows some visual inspection of the enclosed product, the amount of the product which can be inspected through the opening is quite limited (for example, only the printed area on an integrated circuit body). Ideally, most if not all of the product should be visible through the package. Therefore, another object of the present invention has been to provide an electrostatic discharge protective package which provides improved visibility of the enclosed product or article while affording inexpensive electrostatic discharge protection as well as physical protection of the packaged product.

SUMMARY OF THE INVENTION

The present invention packages an electrostatic sensitive product or article by sandwiching the product or article between two plies of electrostatic discharge protective film and then suspending those plies and the sandwiched article within two opposing parts of the resulting package.

In a preferred embodiment of the invention, the package comprises two shells made of a conductive material which provides Faraday Cage protection to the enclosed product with each shell having a recess formed therein. A film of anti-static/static dissipative material is secured to each shell, such that a web is formed over the opening to each recess. When the two shells are closed or placed in juxtaposition, the product or article is sandwiched between the two webs and suspended between the two recesses. Thus, not only is the product protected within an electrically conductive Faraday Cage, but it is also protected against electrostatic build-up by being surrounded or encased by the anti-static/static dissipative film. In addition, and especially if a stretchable film is used, one shell size can be used to package a wide variety of product sizes and shapes because the film is able to conform to the dimensions and shape of the packaged product. Thus, this embodiment is an inexpensive package which affords protection against all forms of electrostatic discharge. By suspending the product within these shells, this embodiment also protects the product against physical damage. When both the shells and film are made of a polymeric material, this embodiment allows the entire package to be recycled. Recyclability is becoming more and more of a concern in the electronic industry.

In another preferred embodiment of the invention, a substrate is separated into two panels with a hole, suitably dimensioned to accommodate the product, passing through each panel. A film of static discharge protective material encloses each panel, such that a web is formed over both ends of each hole. In packaging, the product is positioned between the two juxtapositioned panels such that the product is sandwiched between the two webs and suspended between the two holes. In a modification of this embodiment, a web is formed over only one end of each hole. Sandwiching a product between plies of such films protects the product from electrostatic discharge, and suspending the product within the packaging provides protection against physical damage. Preferably, the film is a relatively high tensile strength stretchable film which enables larger or odd shaped products or articles to be contained in the package. Using a transparent film in this second embodiment, high visibility of the packaged product or article is afforded.

The substrate in this second embodiment is preferably made of corrugated paperboard, because of its low cost, though other structurally sound materials can be used. Paperboard and like materials are not only inexpensive to purchase but inexpensive and easy to form into various embodiments of the present invention.

The presently preferred film material for either embodiment is an anti-static/static dissipative shrink film, EDP-512, made by Cryovac Division of W. R. Grace & Co. This particular film material has good tensile strength, stretchability and is transparent. Another material which may be used is a low-density polyethylene film which has been subjected to highenergy, electron beam radiation in the manner described in U.S. Pat. No. 4,623,594.

The present invention provides an inexpensive but effective way of simultaneously providing physical protection as well as static discharge protection to electrostatic discharge sensitive products and articles. It also facilitates high density packaging of the products.

The above and other objects and advantages of the present invention will become more apparent from the following detailed description of the invention in which:

DETAILED DESCRIPTION OF THE INVENTION

Many of the terms used throughout this application have recently been redefined by the American National Standard Institute in their new Packaging Material Standards for ESD Sensitive Items E1A-541, published in June of 1988. In these new standards, packaging materials are defined as being in the "conductive" range if they have a measurable surface resistivity of less than $10^5$ ohms per square and a volume resistivity of less than $10^4$ ohms per square. The new standard, ANSI/E1A-541-1988, defines "Static-Dissipative Materials" (formerly known as static-dissipative or anti-static materials) as those having a surface resistivity greater than $10^5$ ohms per square, but less than $10^{12}$ ohms per square. And, these same standards now define "Insulative Materials" as those having surface resistivity equal to or greater than $10^{12}$ ohms per square. "Anti-static Materials" are now defined by these new standards as those materials which minimize electrostatic charge when rubbed against or separated from themselves or other similar materials. For purposes of this application, and when used in this application, the terms "anti-static," "static-dissipative," "conductive" and "insulative" used as defined in the new definitions contained in ANSI/E1A-514-1988.

Figure 1:
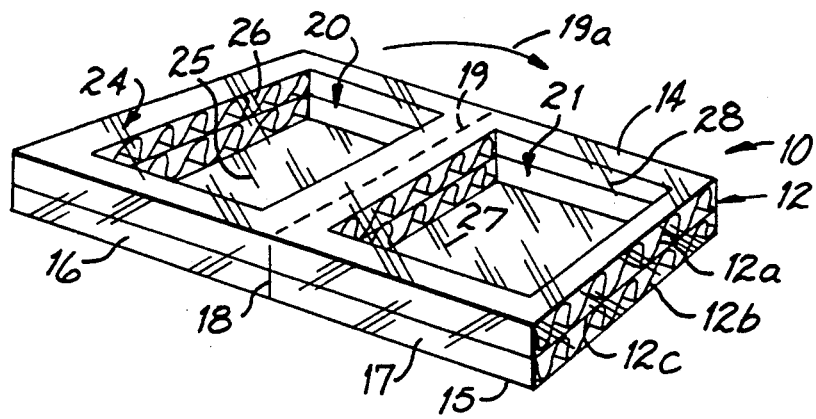
FIG. 1 is a perspective view of one preferred embodiment of the invention of this application in a condition to receive a product therein.

With reference first to FIG. 1, there is illustrated a package 10 embodying one currently preferred embodiment of the present invention. Package 10 comprises a generally rectangular base substrate 12 made of conventional triple face corrugated paperboard or like material. This substrate 12 has a first and second side 14, 15 and is separated into two longitudinal panels 16 and 17 by a transverse score line 18 The score line 18 extends through the second side or face 15 and through both corrugated plies 12a and 12b as well as through the center ply 12c of linerboard. Panels 16 and 17 are foldable along fold line 19 (see arrows 19a in FIG. 1). Each panel 16, 17 has a hole 20 and 21, respectively, passing through it. Each hole has a first and second end corresponding to the first side 14 and second side 15 of substrate 12. Substrate 12 is encased within a stretchable film 24 of transparent static dissipative material. In the preferred embodiment of FIG. 1, this film is heat shrunk around the complete substrate 12. One film which is transparent as well as static dissipative and is heat shrinkable so as to be suitable for use in this application is a film identified as EDP-512 made by Cryovac Division of W. R. Grace & Co. It is characterized by a surface resistivity greater than $10^5$ ohms per square but less than $10^{12}$ ohms per square.

Film 24 forms a web 25 and 26 over the ends of hole 20 in panel 16, and a web 27 and 28 over the ends of hole 21 in panel 17. Webs 25 and 27 are located on the second side 15 of substrate 12, and webs 26 and 28 are located on the first side 14 of substrate 12.

Figure 2:
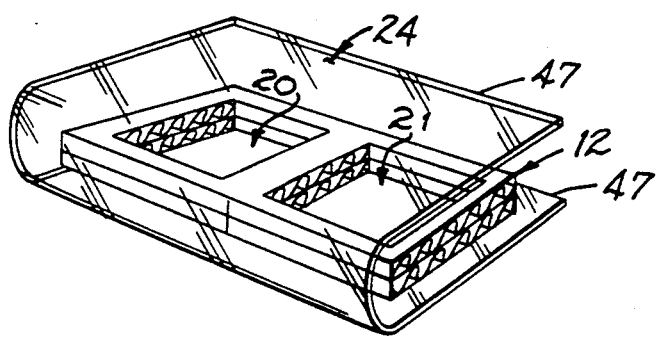
FIG. 2 is an exploded perspective view of the package of FIG. 1 prior to heating of the shrink film portion of the package.

Referring to FIG. 2, there is illustrated an exploded perspective view of the package 10 in the process of being manufactured. As here illustrated, the substrate 12 is triple face corrugated board although it could be of greater or lesser thickness, depending upon the nature of the product to be packaged and the degree of physical protection desired. Alternatively, the substrate could comprise multiple layers of single or double face corrugated material layered to produce the appropriate thickness of substrate. The film 24 is wrapped around the substrate and then secured together at the free edges by a heat bar. Thereafter the encased substrate is exposed to a stream of heated air to shrink the film 24 until it snugly fits around substrate 12. If desired, a tear string (not shown) may be sealed within the plies 47 along with substrate 12 for easy removal of the film 24. This ease of removal is desirable when the film 24 is recyclable. Such recycling is becoming more and more of a concern in the electronics industry.

Figure 5:
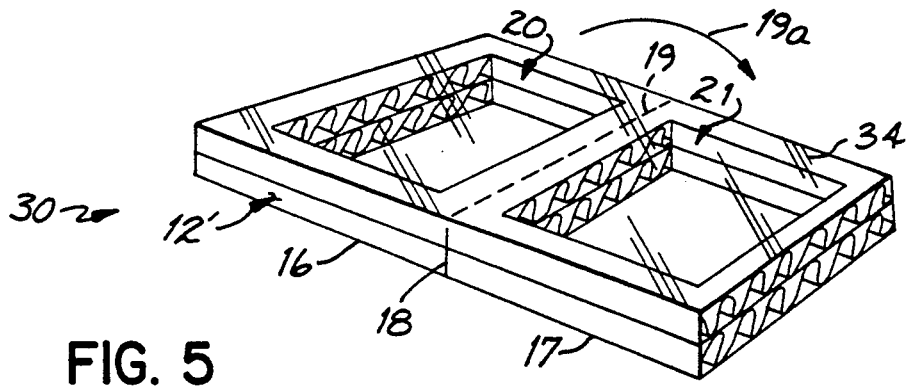
FIG. 5 is a perspective view of a second embodiment of the invention in a condition to receive a packaged product.
Figure 6:
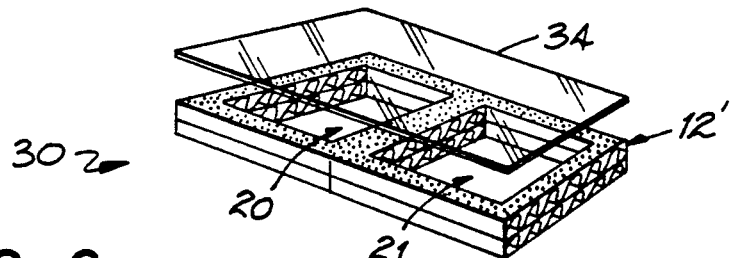
FIG. 6 is an exploded perspective view of the modification of FIG. 5.

As an alternative to the use of a heat shrunk film around the complete substrate 12, a film of transparent static dissipative film may be adhered to only one side of the substrate 12. Such an alternative embodiment package 30 is illustrated in FIGS. 5 and 6. In this embodiment, instead of the substrate 12 being surrounded by the film 24, a stretchable film 34 of transparent static-dissipative material is secured to only the first side 14 of substrate 12′. The substrate 12′ of this embodiment is identical to the substrate 12 of the embodiment of FIGS. 1-4.

Since in the embodiment of FIGS. 5 and 6, only a single sheet of film 34 is used, film 34 must necessarily be bonded, as for example with an adhesive, to substrate 12′. While the film material 34 of this second embodiment may be the same Cryovac film as is employed in the embodiment of FIGS. 1 and 2, it may also be any other static-dissipative film which has the appropriate tensile strength. One other such static-dissipative film suitable for use in this second embodiment is the film described in U.S. Pat. No. 4,623,594 and manufactured by Metalizing Products, Inc. of Winchester, Mass., U.S.A. While package 30 with only its single ply of film 34 may be perfectly adequate for many applications, in terms of protection against physical damage and electrostatic discharge, for some applications, the dual webs 25 and 27 found in package 10 provide an additional desired barrier between the product 40 and a source of potential physical and/or electrostatic discharge damage.

Figure 3:
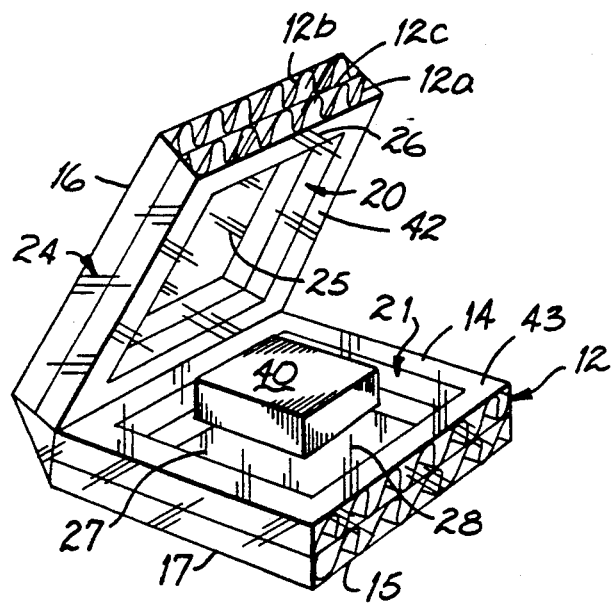
FIG. 3 is a perspective view of the package of FIG. 1, in a partially closed condition and with a product located therein.
Figure 4:
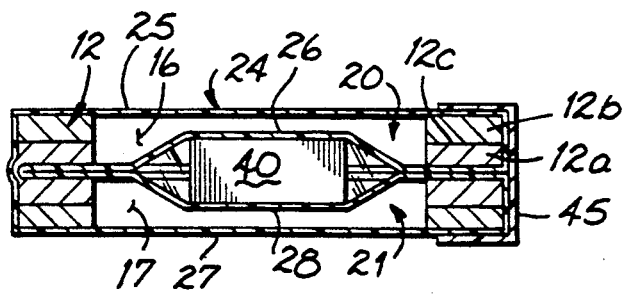
FIG. 4 is a cross-sectional view of the package of FIG. 3 after complete closure of the package.

Referring to FIGS. 3 and 4, a product or article 40 may be enclosed within package 10 (or package 30) by placing the product 40 onto web 28 and folding substrate 12 along fold line 19 until the first side 42 of panel 16 is in contact with or proximate to the first side 43 of panel 17 (see FIG. 4). Once in this closed condition, the product 40 is sandwiched between webs 26 and 28 and suspended between holes 20 and 21. A means 45, such as a strip of tape, is used to maintain the package 10 in the closed or sandwiched condition.

Figure 7:
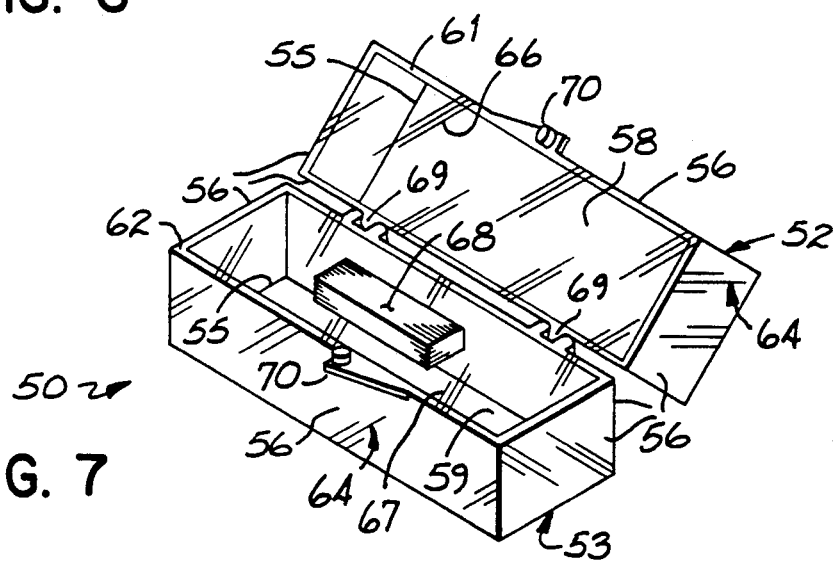
FIG. 7 is a perspective view of an alternative embodiment of the present invention.
Figure 8:
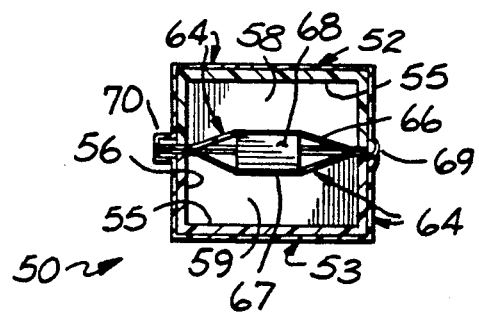
FIG. 8 is a cross-sectional view through the package of FIG. 7 after closure of the package about a packaged product.

When transparent films 24, such as the films described hereinabove, are employed with package 10 or 30, optimum visibility of the product 40 is attained. However, in some applications, visibility may be sacrificed for additional protection against damage by electrostatic discharge from a source outside the package. FIGS. 7 and 8 illustrate a package 50 which affords just such additional protection. In this embodiment, the package 50 comprises two shells 52 and 53. Preferably, these shells are made of a conductive plastic which provides a Faraday Cage around the packaged product. Each shell 52, 53 has a back 55 and four side 56 walls. These walls 55, 56 form a recess 58, 59 in shells 52 and 53, respectively. In addition, the side walls of both shells 52, 53 have top edges 61 and 62, respectively. A film 64 of stretchable, relatively high tensile strength static dissipative material surrounds each shell 52, 53 and forms a web 66 and 67 over each recess 58 and 59, respectively. This film is preferably the same heat shrinkable Cryovac film utilized in the embodiment of FIGS. 1 and 2 and it is preferably heat shrunk around each shell so as to completely encase each shell in the film.

As with the packages of the previous embodiments, the package of FIGS. 7 and 8 enable a product 68 to be sandwiched between webs 66 and 67 and suspended between recesses 58 and 59 by placing the product 68 on, for example, web 67 and rotating shell 52, about hinges 69 molded into the shells. The shells are rotated until top edges 61 and 62 are opposed and come in close proximity to each other. In this embodiment, a snap-fit closure or lock 70 molded into the shell is used to maintain the package 50 in the closed condition and the product 68 in a sandwiched and suspended condition within the package.

An advantage of package 50 is that an enclosed product has protection from an electrostatic discharge originating outside the package as well as protection against the build-up of a charge originating inside the package. The former protection is provided by the electrically conductive material of which the shells 52 and 53 are molded and the latter is provided by the plies of static dissipative film from which the product is suspended between the two shells. And, of course, because the product is suspended within the cavity provided by the recesses in the shells, it is very well protected against physical damages.

While I have described only a limited number of packaging embodiments of this invention, it is to be understood that the invention is not to be limited solely to these embodiments. Various other alternative embodiments will be readily apparently to persons skilled in this art. Accordingly, it is to be understood that changes may be made without departing from the scope of the invention as particularly set forth and described below.

What I claim is:

1. A package for electrostatic discharge sensitive products, comprising:
   a first part and a second part integrally connected along a fold line, each part having a first and second side and a cavity therein, said cavity in each part being open to the first side of each part;
   a film of stretchable electrostatic discharge protective heat shrinkable film material covering each part and each of said first and second sides of each part and forming a web over each cavity,
   whereby a static sensitive product may be packaged by placing it onto the web of one of said parts and folding the other of said parts, along said fold line, toward said one of said parts until said webs are positioned proximate to each other, thereby sandwiching the product between the webs and suspending it within the cavities in said two parts to create a sandwiched and suspended condition of the product; and
   means for maintaining the sandwiched condition of said parts after packaging of a product.

2. The package of claim 1 wherein said film is transparent.

3. The package of claim 1 wherein said parts are two separate components.

4. The package of claim 1 wherein said film is made of a static dissipative material having a surface resistivity of greater than about $10^5$ but less than about $10^{12}$ ohms per square.

5. The package of claim 4 wherein said parts are made of a material which is conductive, having a surface resistivity of less than about $10^5$ ohms per square, in order to provide electrostatic discharge protection to an electrostatic sensitive product contained in said package.

6. The package of claim 1 wherein said two parts are made of paperboard.

7. The package of claim 1 wherein said two parts are made of corrugated paperboard and said cavities are each formed by a hole passing through said corrugated paperboard.

8. A package for electrostatic discharge sensitive products, comprising:
   a first part and a second part integrally connected along a fold line, each part having a first and second side and a cavity therein, said cavity in each part being open to at least the first side of each part;
   a stretchable film of static dissipative heat shrinkable material covering each part and each of said first and second sides of each part and forming a web over each cavity,
   whereby a static sensitive product may be packaged by placing it onto the web of one of said parts and folding the other of said parts, along said fold line, toward said one of said parts until said webs are positioned proximate to each other, thereby sandwiching the product between the webs and within the cavities in said two parts to create a sandwiched and suspended condition of the product; and
   means for maintaining the sandwiched condition of said parts after packaging of a product.

9. A package for electrostatic discharge sensitive products, comprising:
   two shells, each shell having a back and side walls forming a recess, with said side wall each having a top edge, and said top edges forming the opening of said recess;
   a film of heat shrinkable static discharge protective material surrounding and completely enclosing each said shell, with said film forming a web over each said recess,
   whereby a static sensitive product may be packaged by sandwiching it between the webs and suspending it within the recesses in said two shells to create a sandwiched and suspended condition of the product; and
   means for maintaining the sandwiched condition of said shells after packaging of a product.

10. The package of claim 9 wherein said film is transparent.

11. The package of claim 9 wherein said film is made of a static dissipative material having a surface resistivity of greater than about $10^5$ but less than about $10^{12}$ ohms per square.

12. The package of claim 9 wherein said shells are made of a material which is electrically conductive, having a surface resistivity of less than about $10^5$ ohms per square, in order to provide electrostatic discharge protection to an electrostatic discharge sensitive product contained in said package.

13. A package for electrostatic discharge sensitive products, comprising:
   two panels, each panel having a first and second side and a hole passing from side-to-side, each hole having a first and second end corresponding to said sides;
   a film of heat shrinkable static discharge protective material surrounding each panel so as to cover each of said first and second sides of each panel and forming a web over each hole,
   whereby a static sensitive product may be packaged by sandwiching it between the webs and suspending it within the holes in said two panels to create a sandwiched and suspended condition of the product; and
   means for maintaining the sandwiched condition of said panels after packaging of a product.

14. The package of claim 13 wherein said film covers the first side of each said panel and forms a web over the first end of each hole, whereby when a static sensitive product is packaged, the first sides of said panels are opposite to each other.

15. The package of claim 13 wherein the film of heat shrinkable static discharge protective material covers both sides of each panel, with said film forming a web over both ends of each hole.

16. The package of claim 13 wherein said film is stretchable and transparent.

17. The package of claim 13 wherein said panels are separate components.

18. The package of claim 13 wherein said panels are integrally connected together by a fold line.

19. The package of claim 18 wherein said panels form a substrate and said line is a foldable score line which bisects said substrate medially of said holes.

20. The package of claim 13 wherein said film is made of static dissipative material having a surface resistivity of greater than about $10^5$ but less than about $10^{12}$ ohms per square.

21. The package of claim 13 wherein said panels are made of a new material which is conductive, having a surface resistivity of less than about $10^5$ ohms per square, in order to provide electrostatic discharge protection to the static sensitive product packaged.

22. The package of claim 13 wherein said panels are made of a material which is insulative, having a surface resistivity equal to or greater than about $10^{12}$ ohms per square.

23. The package of claim 13 wherein each said panel is made of corrugated paperboard.

24. A method of protecting a static sensitive product against exposure to static discharges in a package having two opposing parts with each part being surrounded and enclosed by a stretchable heat shrinkable static discharge protective film, comprising the steps of: forming or obtaining said package having two opposing parts with each part being surrounded and enclosed by said stretchable heat shrinkable static discharge protective film.

25. A package for electrostatic discharge sensitive products, comprising:
   a first part and a second part, each part having a first and second side and a cavity therein, said cavity in each part being open to the first side of each part;
   a film of stretchable heat shrinkable electrostatic discharge protective material encasing each part and forming a web over each cavity,
   whereby a static sensitive product may be packaged by placing it onto the web of one of said parts and moving the other of said parts toward said one of said parts until said webs are positioned proximate to each other, thereby sandwiching the product between the webs and suspending it within the cavities in said two parts to create a sandwiched and suspended condition of the product; and
   means for maintaining the sandwiched condition of said parts after packaging of a product.

26. The package of claim 25 wherein a film of static discharge protective material completely covers both sides of each said part.

27. The package of claim 25 wherein said film is stretchable and transparent.

28. The package of claim 27 wherein said film is made of a static dissipative material having a surface resistivity of greater than about $10^5$ but less than about $10^{12}$ ohms per square.

* * * * *

UNITED STATES PATENT AND TRADEMARK OFFICE
CERTIFICATE OF CORRECTION

PATENT NO. : 5,218,510  
DATED : June 8, 1993  
INVENTOR(S) : Judson A. Bradford Page 1 of 2

It is certified that error appears in the above-indentified patent and that said Letters Patent is hereby corrected as shown below:

Column 8, line 65, delete "new".

Column 9, line 17, change the period to a semicolon and add the following two paragraphs:

--forming or obtaining said package having two opposing parts with each part being surrounded and enclosed by said stretchable heat shrinkable static discharge protective film;

sandwiching a static sensitive product between two plies of the stretchable heat shrinkable static discharge protective film; and sandwiching the edges of said plies between the two opposing package parts so that the product is suspended by said plies within said package.--

UNITED STATES PATENT AND TRADEMARK OFFICE
CERTIFICATE OF CORRECTION

PATENT NO. : 5,218,510
DATED : June 8, 1993
INVENTOR(S) : Judson A. Bradford

It is certified that error appears in the above-indentified patent and that said Letters Patent is hereby corrected as shown below:

Column 9, lines 12 and 13, "forming" should begin a new paragraph

Signed and Sealed this

Second Day of August, 1994

Attest:

BRUCE LEHMAN

Attesting Officer　　Commissioner of Patents and Trademarks